United States Patent [19]

Erickson

[11] 4,103,148
[45] Jul. 25, 1978

[54] DYNAMIC PULSE DIFFERENCE CIRCUIT

[75] Inventor: Gerald L. Erickson, Richland, Wash.

[73] Assignee: The United States of America as represented by the United States Department of Energy, Washington, D.C.

[21] Appl. No.: 744,500

[22] Filed: Nov. 24, 1976

[51] Int. Cl.² ............ G06M 3/14; G01T 1/00
[52] U.S. Cl. ............ 235/92 PC; 235/92 EV; 235/92 R; 250/336
[58] Field of Search ........ 235/92 PC, 92 EV, 92 NG, 235/92 PL; 250/336; 328/44

[56] References Cited

U.S. PATENT DOCUMENTS

| | | | |
|---|---|---|---|
| 2,991,365 | 7/1961 | Churchill | 235/92 PC |
| 3,725,688 | 4/1973 | Brunson et al. | 235/92 PC |
| 3,924,106 | 12/1975 | Keefe | 235/92 PC |

OTHER PUBLICATIONS

NJ-20 Up-Down Counter Description, Harshaw Chemical Company, Mar. 1975.

*Primary Examiner*—Joseph M. Thesz
*Attorney, Agent, or Firm*—Dean E. Carlson; Frank H. Jackson; Donald P. Reynolds

[57] ABSTRACT

A digital electronic circuit of especial use for subtracting background activity pulses in gamma spectrometry comprises an up-down counter connected to count up with signal-channel pulses and to count down with background-channel pulses. A detector responsive to the count position of the up-down counter provides a signal when the up-down counter has completed one scaling sequence cycle of counts in the up direction. In an alternate embodiment, a detector responsive to the count position of the up-down counter provides a signal upon overflow of the counter.

1 Claim, 2 Drawing Figures

DYNAMIC PULSE DIFFERENCE CIRCUIT

CONTRACTUAL ORIGIN OF THE INVENTION

The invention described herein was made in the course of, or under, a contract with the United States Energy Research and Development Administration.

BACKGROUND OF THE INVENTION

This invention relates to an apparatus for separating the background of random counts from the total of counts obtained in the gathering of data to produce a net pulse rate proportional to the activity of gamma rays in a desired energy range.

In many fields that require digital signal conditioning it is desirable to subtract a statistically variable background signal from the detected gross gamma signal. It is also frequently desirable to monitor the difference over a wide range of count rates. That continuous difference is referred to herein as a dynamic difference, since it comprises a continuing subtraction in real time. Such a dynamic difference is particularly desirable in gamma spectrometry where the resultant difference signal is used for continuous recording or process control, or both, in real time. Such circuits have been constructed in the past using analog electronic circuits. One channel is normally available that contains the combined set of pulses of the gamma rays being measured and the undesired background pulses. A second channel is set up to respond only to a signal proportional to the undesired background pulses, which signal in general has the same statistical properties as the background in the signal channel but is not necessarily coincident therewith in time so that direct subtraction is not effective. Past practice has been to convert the pulse output of the signal channel to an analog d-c signal and to convert the background pulses to another d-c signal. The two are subtracted in a d-c subtraction circuit to obtain a difference signal. Such a circuit has two major disadvantages. First, the dynamic range is relatively small, being about 2 decades without a manual change range setting of the count-rate circuits. Even with the use of log count rate circuits the loss in accuracy becomes significant over a large dynamic range. Second, any d-c drift of the analog circuits appears as a measurement error since it cannot be separated from the d-c analog signals.

It is an object of the present invention to provide a better circuit for obtaining the difference between a signal including noise and the noise signal over a large dynamic range, of the order 6–8 decades.

It is a further object of the present invention to provide a digital circuit for subtracting a noise background from a signal including noise of the same statistical parameters.

It is a further object of the present invention to provide a dynamic pulse difference circuit having a range of useful operation on the order of 6–8 decades using simple circuitry.

It is a further object of the present invention to provide a dynamic pulse difference circuit that is not sensitive to errors caused by d-c drift.

Other objects will become apparent in the course of a detailed description of the invention.

SUMMARY OF THE INVENTION

A dynamic difference is obtained between a continuing count of pulses including background and a set of background pulses observing the same statistics by connecting a counter to count up in response to pulses of both signal and background and to count down in response to a signal proportional to background signal. A numeric sequence detector responsive to the register of the counter provides an output signal when the net count achieves one scaling cycle of a preselected length. The output of the numeric sequence detector is then proportional to the net dynamic difference between the up and down counts. In an alternate embodiment, a detector responsive to the counter responds to overflow of the counter to detect the net dynamic difference.

DETAILED DESCRIPTION OF THE INVENTION

Figure 1:
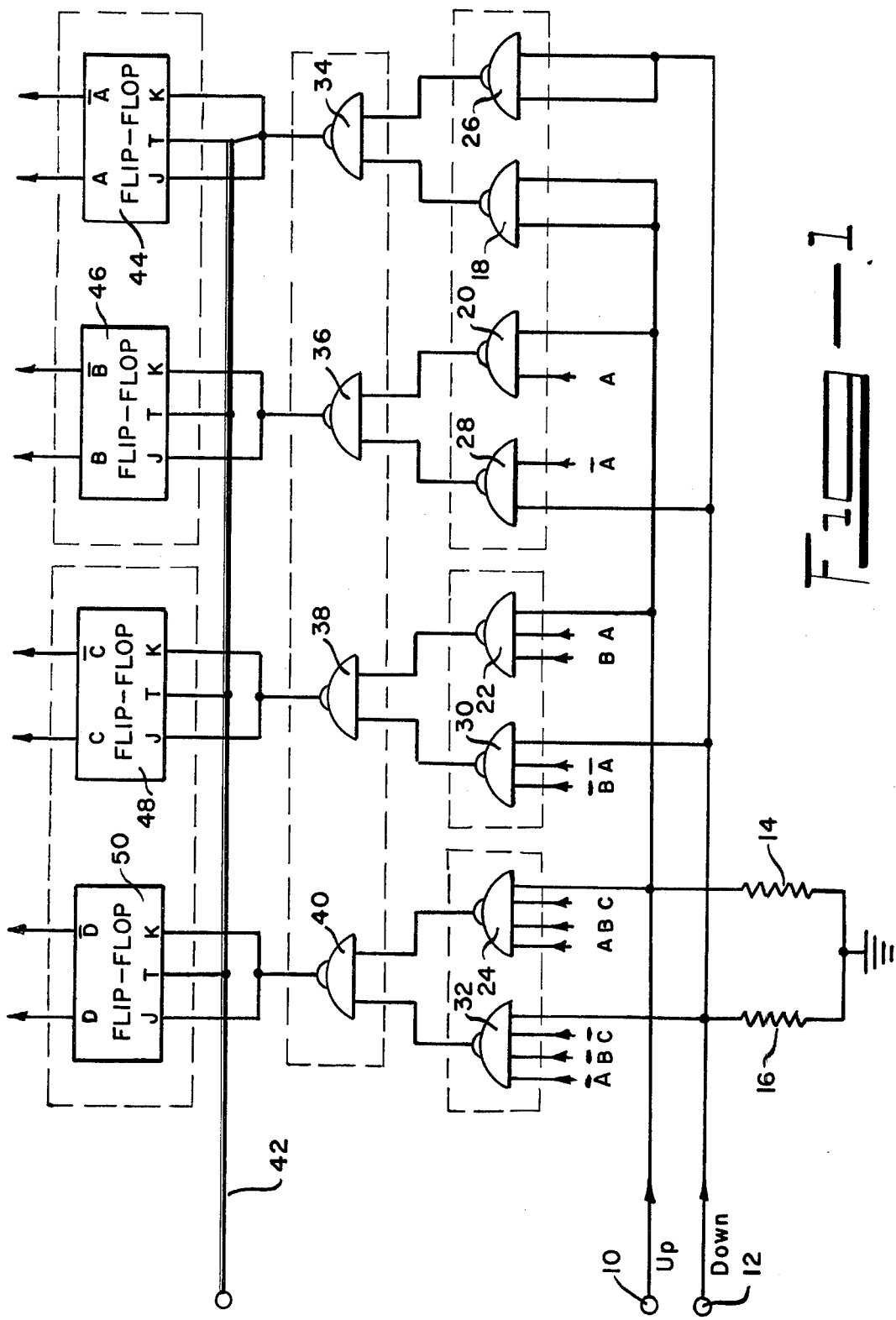
FIG. 1 is a functional block diagram of the up-down ring counter of the present invention.

FIG. 1 is a functional block diagram of a realization of the up-down counter of the present invention. In FIG. 1, terminal 10 receives input pulses consisting of the desired signal pulses plus undesired background pulses and terminal 12 receives pulses that are proportional to the background pulses. Since the input signal pulses include more counts than the background, it is to be expected that terminal 10 will receive a signal to count up and terminal 12 will receive a signal to count down. The up signal is applied across resistor 14 and the down signal is applied across resistor 16, each with respect to electrical ground. The up signal is connected to serve as both inputs to NAND gate 18 and to serve as one input to NAND gates 20, 22 and 24. The down signal is connected to provide both inputs to NAND gate 26 and to provide one input to NAND gates 28, 30 and 32. NAND gates 18 and 26 thus serve as inverters. Their outputs are taken as the inputs to NAND gate 34. The outputs of NAND gates 20 and 28 supply the input to NAND gate 36. The outputs of NAND gates 22 and 30 are the inputs to NAND gate 38 and the outputs from NAND gates 24 and 32 are the inputs to NAND gate 40. There is thus an output from NAND gate 34 whenever there is either an up count or a down count at terminals 10 and 12, respectively. In a typical measuring situation using a single scintillation radiation detector, coincident pulses cannot be allowed to occur on terminals 10 and 12. If coincident pulses were to occur, an output would be generated from NAND gate 34 and the balance of the circuitry, to be described later, would cancel the counts to give a net of zero. If multiple detectors are used where coincident pulses are a significant probability, it would be desirable to connect special purpose anticoincidence circuitry at terminals 10 and 12, a routine modification to the circuit.

The output of NAND gate 34 serves two functions. The first is a timing function. The output of NAND gate 34 is connected to clock bus 42 to supply a triggering pulse for seven different flip-flops. The output of NAND gate 34 is also connected to both inputs to flip-flop 44. This generates an output $\bar{A}$ whenever there is either a first up count or a first down count at terminals 10 or 12, respectively, and generates an output A whenever there is either a second up count or a second down count. The output A is connected as an input to NAND gate 20, NAND gate 22 and NAND gate 24. Output $\bar{A}$ of flip-flop 44 is connected as an input to NAND gate 28, NAND gate 30 and NAND gate 32. The clock output is connected by way of bus 42 to the trigger inputs of flip-flops 44, 46, 48 and 50. NAND gate 36 is connected to the J and K input terminals of flip-flop 46. The output of NAND gate 38 is connected to provide the J and K inputs to flip-flop 48. The output of NAND gate 40 is connected to supply the J and K inputs to flip-flop 50.

The outputs of flip-flops 44, 46, 48 and 50 are characterized as follows: A positive output from flip-flop 44 is denoted A and a negative output, $\bar{A}$. A positive output from flip-flop 46 is denoted B; a negative output, $\bar{B}$. A positive output from flip-flop 48 is denoted C; a negative output, $\bar{C}$. A positive output from flip-flop 50 is denoted D; a negative output, $\bar{D}$. The output B is taken as an input to NAND gate 22 and to NAND gate 24. The output B is taken as an input to NAND gates 30 and 32. The output C is taken as an input to NAND gate 24 and the output C is taken as an input to NAND gate 32. The combination of elements in FIG. 1 comprises a ring counter that counts up for pulses on terminal 10 and down for pulses on terminal 12 over a cycle of 16 counts ($2^4$, where 4 is the number of binary stages in FIG. 1). The number of stages that is necessary in a particular application is a function of the statistical deviation of the pulse rates for the up and down signals. Stated in another way, the number of binary stages in the up-down counter should be chosen so that there is a negligible probability of a string of pulses in which the down count exceeds the up count by the number 2 raised to the power of the number of binary stages.

The up-down counter described above is a ring counter; that is to say, it counts to its capacity and repeats. The same results could be achieved with a counter that does not cycle in this way, but instead counts to its capacity and overflows. Such a counter is referred to herein as a linear counter to distinguish it from a ring counter. The number of stages in the linear counter is determined in the same way as that described for the ring counter.

Figure 2:
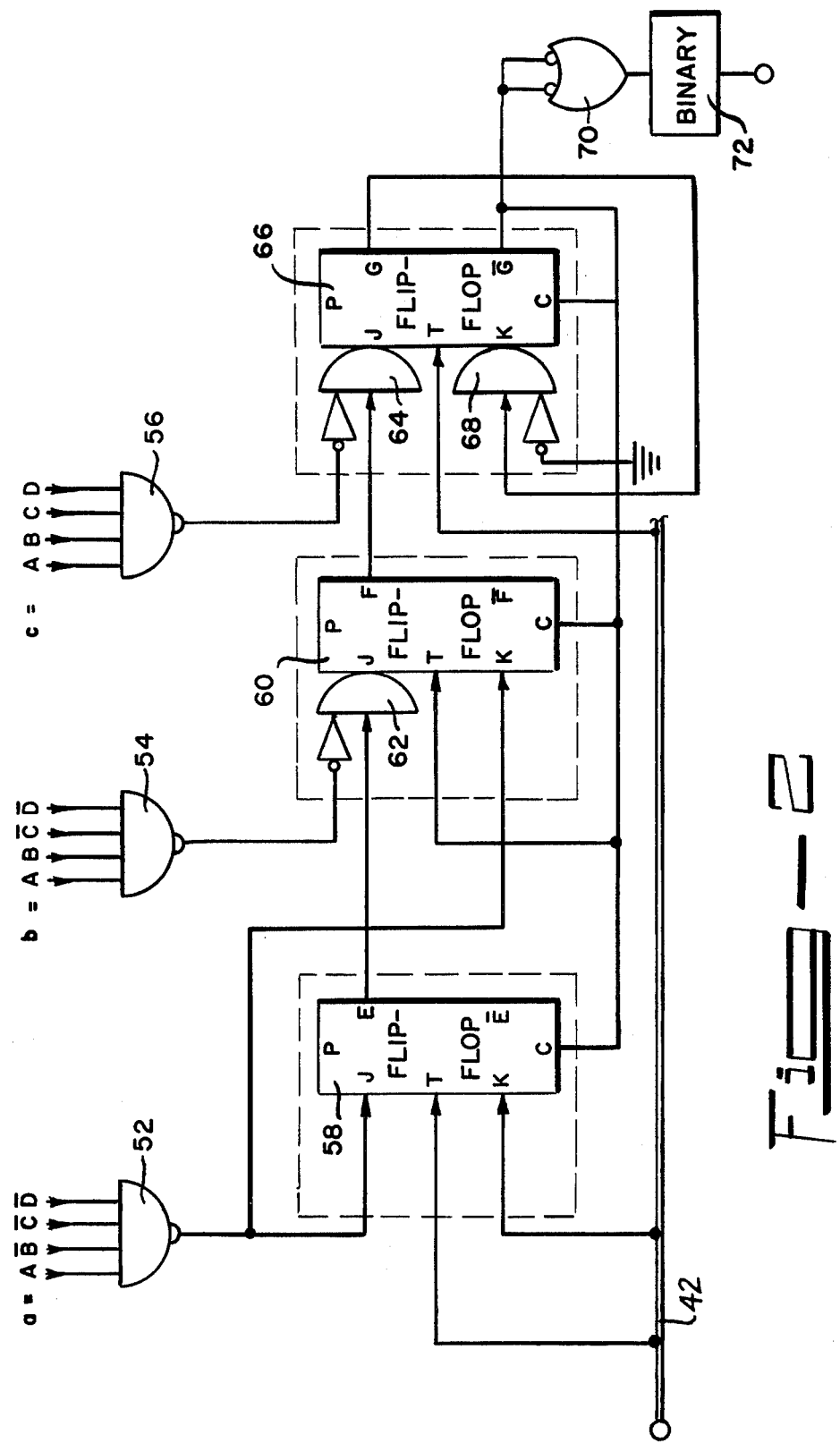
FIG. 2 is a functional block diagram of the numeric sequence detector of the present invention.

All of the outputs of flip-flops 44, 46, 48 and 50 of FIG. 1 except for the $\bar{A}$ output of flip-flop 44 together with clock bus 42 of FIG. 1 supply inputs to FIG. 2 which is a functional block diagram of the numeric sequence detector of the present invention. This is an embodiment of a digital logic detector. In FIG. 2, NAND gate 52 receives inputs A, $\bar{B}$, $\bar{C}$, and $\bar{D}$, comprising a binary 1 (0001). In other words, NAND gate 52 receives an impulse whenever the ring scaler of FIG. 1 passes the number 1. NAND gate 54 is connected to receive as inputs the signals corresponding to A, B, $\bar{C}$, and $\bar{D}$. This is the binary number equivalent to 3 (0011). NAND gate 54 thus generates an output whenever the ring scaler of FIG. 1 reaches the number 3. NAND gate 56 is connected to receive the inputs A, B, C and D. This corresponds to the binary number 15 (1111). NAND gate 56 thus generates an output whenever the up-down ring counter of FIG. 1 reaches the number 15. The output of NAND gate 52 supplies a J input to flip-flop 58 and a K input to flip-flop 60. The output of NAND gate 54 is connected through AND gate 62 to the J input of flip-flop 60. The output of NAND gate 56 is connected through AND gate 64 to the J input to flip-flop 66. Clock bus 42 is connected to the trigger inputs to flip-flops 58, 60 and 66. The K terminal of flip-flop 58 is grounded. The positive output of flip-flop 58 is connected as an input to AND gate 62. The positive output of flip-flop 60 is connected as an input to AND gate 64. The positive output of flip-flop 66 is connected as an input to AND gate 68, the other input of which is grounded. The negative output of flip-flop 66 is connected to flip-flops 58 and 60 to supply a clock as an input to NOR gate 70 which is connected as an inverter. The output of NOR gate 70 is connected as an input to binary 72 which generates a positive output pulse for each completion of a full cycle on the ring counter in the positive sequence (1, 3, 15). Each such complete positive sequence represents a net count of 16 net pulses above background. The count of net pulses above background represents a continuous difference or, as described earlier, a dynamic difference of pulses above background. Because the count is obtained digitally rather than on an analog basis, it is free of the possible d-c drifts that appear as measuring errors when analog circuits are used.

The dynamic difference is obtained from the linear counter by a digital logic detector that counts the number of overflow pulses, since each overflow pulse represents one net count above the dynamically subtracted background. This count is also obtained digitally and is thus similarly free of the d-c drifts possible with analog circuits. It should be noted that the ring counter is most readily used to produce sequences which are counted. The count of sequences is thus a fixed fraction (here, 1/16th) of the dynamic difference. The linear counter produces an overflow that is the dynamic difference. Routine considerations of ease of signal processing will determine which of the embodiments is selected by the designer.

The circuit of FIGS. 1 and 2 for the practice of the present invention has been constructed and used at the Hanford Works to enhance the detection of radioactive $I^{131}$ in a monitor of effluent water. In the model that was built, resistors 14 and 16 were selected to be 100 ohms. NAND gates 18, 20, 26 and 28 were included in an SN7400, manufactured by Texas Instruments Company, as were all the circuit elements identified herein that begin with the letters "SN." NAND gates 22 and 30 were included in an SN7410. NAND gates 24 and 32 were included in an SN7420. NAND gates 34, 36, 38 and 40 were part of an SN7400. Flip-flops 44 and 46 were included in one SN7473 dual edge-triggered M-S flip-flop, and flip-flops 48 and 50 were in another. NAND gates 52, 54 and 56 were SN7430's. Flip-flops 58, 60 and 66 were SN7470's. AND gates 62, 64 and 78 were built in as parts of the SN7470 chips with which each was associated. NOR gate 70 and binary 72 together were part of an SN15851 chip. Some of the elements used in FIG. 2 had unused terminals or gates that where left open, connected together, or grounded in a way that is obvious to the electronic designer. The particular application for which the dynamic pulse difference circuit was built exhibited adequate sensitivity and background discrimination with four binary circuits. Other applications might require more binary elements or might permit fever. There are two basic design compromises. First, the closer the background level is to the detection level, the more desirable it is to have extra binary stages to minimize the possibility of undetected negative sequences of counts. Second, the more binary stages that are added, the greater the increase in cost and complexity. It is therefore a matter of design compromise to arrive at an appropriate number of binary stages based upon the relative levels of measuring counts and background and also the statistics to be expected of both.

The embodiments of the invention in which an exclusive property or privilege is claimed are defined as follows:

1. A digital electronic circuit for producing pulses proportional to a continuously running net count of the difference between gamma pulses and a background of gamma pulses, the circuit comprising:
   a first terminal (10) receiving the input signal pulse;
   a second terminal (12) receiving the proportional background pulse;
   a first NAND gate (18) connected to the first terminal (10) to invert the total count;
   a second NAND gate (26) connected to the second terminal (12) to invert the background count;
   a third NAND gate (34) connected to the first and second NAND gates (18 and 26) to receive outputs therefrom;
   a first flip-flop (44) connected to the third NAND gate (34) to receive therefrom a clock pulse and triggering pulses and to generate therefrom a first count pulse and a second count pulse;
   a fourth NAND gate (20) connected to the first terminal (10) and the first flip-flop (44) and receiving the first count pulse therefrom;
   a fifth NAND gate (28) connected to the second terminal (12) and the first flip-flop (44) and receiving the second count pulse therefrom;
   a sixth NAND gate (36) connected to the fourth and fifth NAND gates (20 and 28) and responsive to outputs therefrom;
   a clock bus (42) connected to the third NAND gate (34) to receive and couple a clock pulse therefrom;
   a second flip-fllp (46) connected to the sixth NAND gate (36) and the clock bus (42) and receiving inputs therefrom to generate a third count pulse and a fourth count pulse;
   a seventh NAND gate (22) connected to the first terminal (10), the first flip-flop (44), and the second flip-flop (46) and receiving a first count pulse from the first flip-flop (44) and a third count pulse from the second flip-flop (46);
   an eighth NAND gate (30) connected to the second terminal (12), the first flip-flop (44), and the second flip-flop (46) and receiving a second count pulse from the first flip-flop (44) and a fourth count pulse from the second flip-flop 46;
   a ninth NAND gate (38) connected to the seventh and eighth NAND gates (22 and 30) and responsive to outputs therefrom;
   a third flip-flop (48) connected to the ninth NANd gate (38) and the clock bus (42) and receiving inputs therefrom to generate a fifth count pulse and a sixth count pulse;
   a tenth NAND gate (24) connected to the first terminal (10), the first, second, and third flip-flops (44, 46, and 48) and receiving a first count pulse from the first flip-flop (44), a third count pulse from the second flip-flop (46), and a fifth count pulse from the third flip-flop (48);
   an eleventh NAND gate (32) connected to the second terminal (12) and to the first, second, and third flip-flops (44, 46, and 48) and receiving a second count pulse from the first flip-flop (44), a fourth count pulse from the second flip-flop (46) and a sixth count pulse from the third flip-flop (48);
   a twelfth NAND gate (40) connected to the tenth and eleventh NAND gates (24 and 32) to receive an input therefrom;
   a fourth flip-flop (50) connected to the twelfth NAND gate (40) and the clock bus (42) and receiving inputs therefrom to generate a seventh count pulse and an eighth count pulse;
   a thirteenth NAND gate (52) connected to the first, second, third, and fourth flip-flops (44, 46, 48 and 50) and receiving a first count pulse from the first flip-flop (44), a fourth count pulse from the second flip-flop (46), a sixth count pulse from the third flip-flop (48), and an eighth count pulse from the fourth flip-flop (50);
   a fifth flip-flop (58) connected to the thirteenth NAND gate (52), the clock bus (42) and to an electrical ground and generating an output;
   a fourteenth NAND gate (54) connected to the first, second, third, and fourth flip-flops (44, 46, 48, and 50) and receiving a first count pulse from the first flip-flop (44), a third count pulse from the second flip-flop (46), a sixth count pulse from the third flip-flop (48), and an eighth count pulse from the fourth flip-flop (50);
   a first AND gate (62) connected to the fourteenth NAND gate (54) and the fifth flip-flop (58) and receiving inputs therefrom;
   a sixth flip-flop (60) connected to the first AND gate (62), the thirteenth NAND gate (52), and the clock bus (42), receiving inputs therefrom, and generating an output in response to the inputs;
   a fifteenth NAND gate (56) connected to the first, second, third, and fourth flip-flops (44, 46, 48, and 50) and receiving a first count pulse from the first flip-flop (44), a third count pulse from the second flip-flop (46), a fifth count pulse from the third flip-flop (48), and a seventh count pulse from the fourth flip-flop (50);
   a second AND gate (64) connected to the fifteenth NAND gate (56) and the sixth flip-flop (60) and receiving inputs therefrom;
   a seventh flip-flop (66) connected to the second AND gate (64) and the clock bus (42) and receiving inputs therefrom, the seventh flip-flop (66) generating as outputs an up pulse and a down pulse, the down pulse coupled to the fifth flip-flop (58) and the sixth flip-flop (60);
   a third AND gate (68) connected to the seventh flip-flop (66) and to electrical ground, receiving as inputs the up pulse from the seventh flip-flop (66) and the electrical ground, and producing an output that is supplied as an input to the seventh flip-flop (66);
   a NOR gate (70) connected to the seventh flip-flop (66), receiving as input therefrom the down pulse, and producing an inverted pulse; and
   a binary (72) connected to the NOR gate (70) and receiving the inverted pulse therefrom to produce a positive output pulse,
   which pulse is proportional to a continuously running net count of the difference between the input count and the background count.

* * * * *